(12) United States Patent
Deng (10) Patent No.: US 8,498,143 B2
(45) Date of Patent: Jul. 30, 2013

(54) SOLID-STATE MEMORY CELL WITH IMPROVED READ STABILITY

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 13/104,735

(22) Filed: May 10, 2011

(65) Prior Publication Data

US 2012/0224414 A1 Sep. 6, 2012

Related U.S. Application Data

(60) Provisional application No. 61/449,518, filed on Mar. 4, 2011.

(51) Int. Cl.
*G11C 11/00* (2006.01)
(52) U.S. Cl.
USPC .......................................... 365/154; 365/190
(58) Field of Classification Search
USPC ..................... 365/154, 190, 189.03
See application file for complete search history.

(56) References Cited

U.S. PATENT DOCUMENTS

| 2004/0052106 | A1* | 3/2004 | Ohtani | 365/158 |
| 2006/0250838 | A1* | 11/2006 | Ramaraju et al. | 365/154 |
| 2012/0069650 | A1* | 3/2012 | Yang et al. | 365/184 |

OTHER PUBLICATIONS

Takeda et al. "A Read-Static-Noise-Margin-Free SRAM Cell for Low-VDD and High-Speed Applications," J. Solid-State Circuits, vol. 41, No. 1 (IEEE, Jan. 2006), pp. 113-121.
U. S. Appl. No. 12/834,914, filed Jul. 13, 2010, entitled "Memory Cell with Equalization Write Assist Solid-State Memory."
U.S. Appl. No. 12/822,706, filed Jun. 24, 2010, entitled "Bit-by-Bit Write Assist for Solid-State Memory."
Takeda et al., "A Read-Static-Noise-Margin-Free SRAM Cell for Low-VDD and High-Speed Applications", J. Solid-State Circuits, vol. 41, No. 1 (IEEE, Jan. 2006), pp. 113-121.
U.S. Appl. No. 12/834,914, filed Jul. 13, 2010, entitled "Memory Cell with Equalization Write Assist Solid-State Memory".
U.S. Appl. No. 12/827,706, filed Jun. 24, 2010, entitled "Bit-by-Bit Write Assist for Solid-State Memory".

* cited by examiner

*Primary Examiner* — Vu Le
(74) *Attorney, Agent, or Firm* — Rose Alyssa Keagy; W. James Brady; Frederick J. Telecky, Jr.

(57) ABSTRACT

A solid-state memory in which stability assist circuitry is implemented within each memory cell. Each memory cell includes a storage element, such as a pair of cross-coupled inverters, and an isolation gate connected between one of the storage nodes and the input of the opposite inverter. The isolation gate may be realized by complementary MOS transistors connected in parallel, and receiving complementary isolation control signals. In read cycles, or in unselected columns during write cycles, the isolation gate is turned off slightly before the word line is energized, and turned on at or after the word line is de-energized. By isolating the input of one inverted from the opposite storage node, the feedback loop of the cross-coupled inverters is broken, reducing the likelihood of a cell stability failure.

22 Claims, 9 Drawing Sheets

SOLID-STATE MEMORY CELL WITH IMPROVED READ STABILITY

CROSS-REFERENCE TO RELATED APPLICATIONS

This application claims priority, under 35 U.S.C. §119(e), of Provisional Application No. 61/449,518, filed Mar. 4, 2011, incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to static random access memory (SRAM) cells and devices.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

Figure 1A:
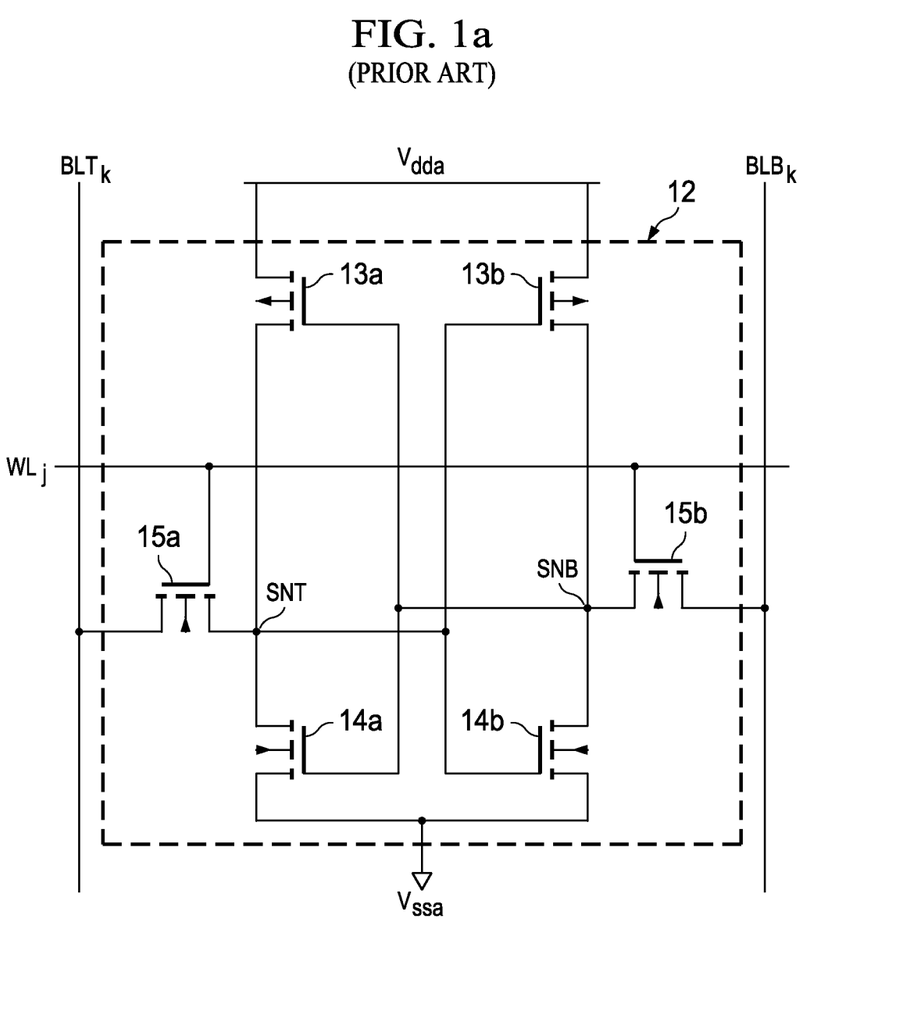
FIG. 1*a* is an electrical diagram, in schematic form, of a conventional 6-transistor static random access memory (SRAM) cell.

An example of a conventional SRAM cell is shown in FIG. 1a. In this example, SRAM cell 12 is a conventional six-transistor (6-T) static memory cell 12, which in this case is in the $j^{th}$ row and $k^{th}$ column of a memory array. SRAM memory cell 12 is biased between the voltage on power supply line $V_{dda}$ and a ground reference voltage $V_{ssa}$. SRAM memory cell 12 is constructed in the conventional manner as a pair of cross-coupled CMOS inverters, one inverter of series-connected p-channel load transistor 13a and n-channel driver transistor 14a, and the other inverter of series-connected p-channel load transistor 13b and n-channel transistor 14b; the gates of the transistors in each inverter are connected together and to the common drain node of the transistors in the other inverter, in the usual manner. The common drain node of transistors 13a, 14a constitutes storage node SNT, and the common drain node of transistors 13b, 14b constitutes storage node SNB, in this example. N-channel pass transistor 15a has its source/drain path connected between storage node SNT and bit line $BLT_k$ for the $k^{th}$ column, and n-channel pass transistor 15b has its source/drain path connected between storage node SNB and bit line $BLB_k$. The gates of pass transistors 15a, 15b are driven by word line $WL_j$ for this $j^{th}$ row in which cell 12 resides.

In operation, bit lines $BLT_k$, $BLB_k$ are typically precharged to a high voltage (at or near power supply voltage $V_{dda}$), and are equalized to the same voltage at the beginning of both read and write cycles, after which bit lines $BLT_k$, $BLB_k$ then float at that precharged voltage. To access cell 12 for a read operation, word line $WL_j$ is then energized, turning on pass transistors 15a, 15b, and connecting storage nodes SNT, SNB to the then-floating precharged bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of then-floating precharged bit lines $BLT_k$, $BLB_k$ low (i.e., to a voltage at or near ground voltage $V_{ssa}$) depending on the data state to be written. Upon word line $WL_j$ then being energized, the low level bit line $BLT_k$ or $BLB_k$ will pull down its associated storage node SNT, SNB, causing the cross-coupled inverters of addressed cell 12 to latch in the desired state.

As mentioned above, device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node SNT, if bit line $BLT_k$ is unable to sufficiently discharge storage node SNT to trip the inverter of transistors 13b and 14b, cell 12 may not latch to the desired data state.

Cell stability failures are the converse of write failures—a write failure occurs if a cell is too stubborn in changing its state, while a cell stability failure occurs if a cell changes its state too easily, such as may occur to an unselected cell during a write to a cell in its same row. More specifically, an unselected cell in a selected row is commonly referred to as a "half-selected" cell, as will now be described in connection with FIG. 1b.

Figure 1B:
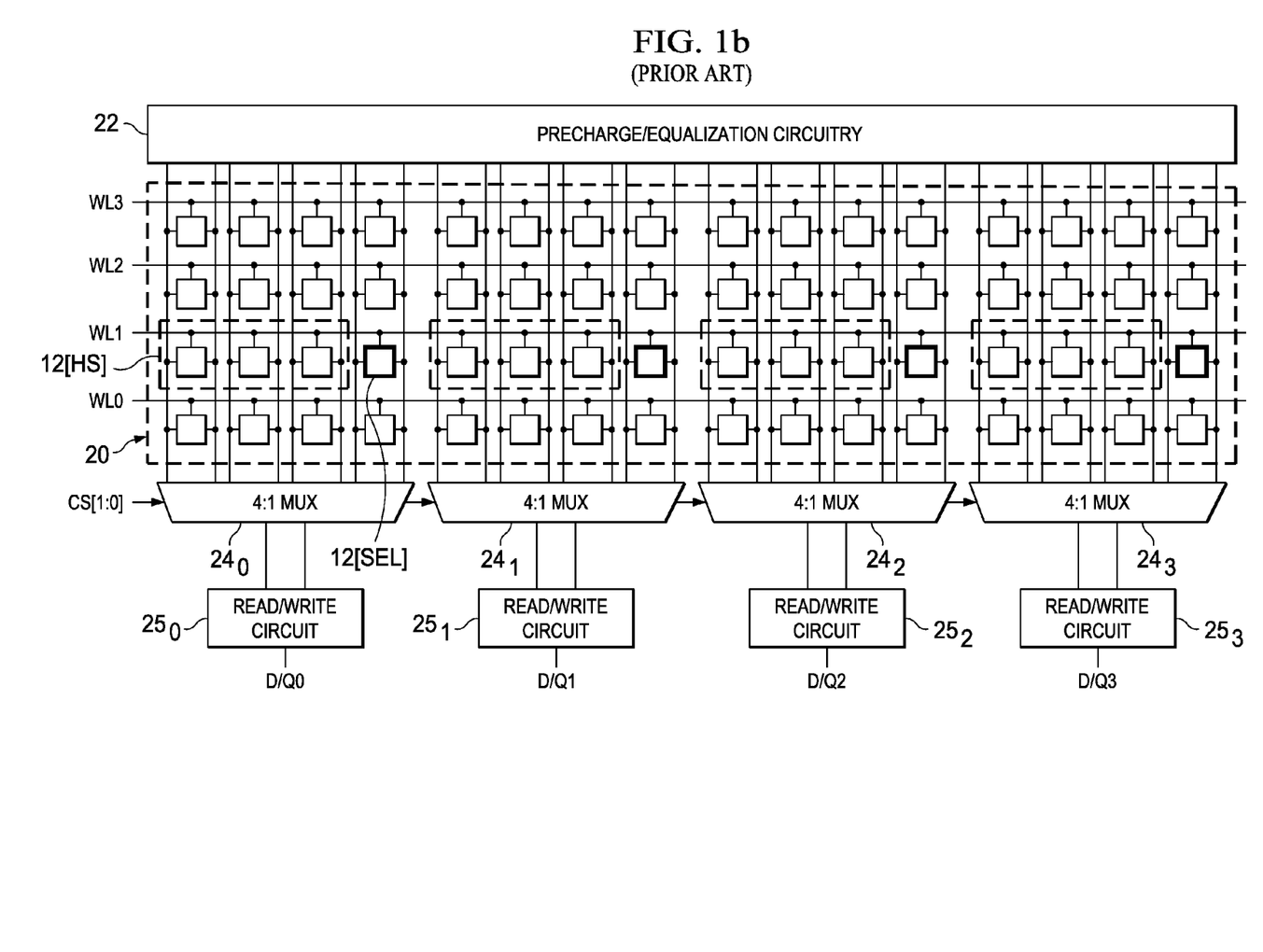
FIG. 1*b* is an electrical diagram, in block form, of an SRAM in a conventional interleaved architecture.

FIG. 1b illustrates an example of a conventional interleaved array 20 of SRAM cells 12, each cell 12 constructed in the manner described relative to FIG. 1a. A pair of bit lines are shared by each column of SRAM cells 12, and extend between precharge/equalization circuitry 22 and column select multiplexers 24, with SRAM cells 12 in that column connected to those bit lines in the manner described above relative to FIG. 1a. SRAM cells 12 are also arranged in rows, with each row of cells 12 sharing one of word lines WL0 through WL3. One of word lines WL0 through WL3 is driven active by a row decoder and word line driver (not shown), in response to a row address value.

Array 20 in this example includes sixty-four SRAM cells 12, in four rows and sixteen columns. This architecture is referred to as interleaved, in that the columns are grouped such that the addressing of a data word selects one column in each group of columns, along the selected row. In this example, the groups are of four columns each, such that a given column address value selects one column from each group. This interleaving is accomplished, in this conventional architecture, by column select multiplexers $24_0$ through $24_3$, each associated with four adjacent columns of cells 12. Each of column select multiplexers $24_0$ through $24_3$ select one column from its group of four in response to the state of the least significant two column address bits CS[1:0], as applied by column decode circuitry (not shown). The columns selected by column select multiplexers $24_0$ through $24_3$ are placed in communication with a respective one of read/write circuits $25_0$ through $25_3$. In this architecture, each read/write circuit $25_0$ through $25_3$ is connected to a corresponding input/output line D/Q0 through D/Q3, respectively, as shown.

FIG. 1b illustrates an example of a write cycle being applied to four SRAM cells 12[SEL] in array 20. In this example, selected SRAM cells 12[SEL] are in the row associated with word line WL1, and reside in the fourth column in each of the four groups of columns associated with corresponding read/write circuits $25_0$ through $25_3$ (i.e., column address bits CS[1:0] both carry a "1" logic level). Other cells 12[HS] that are in the same row as selected SRAM cells 12[SEL], but that are in the unselected columns, are referred to as "half-selected". During a write to selected SRAM cells 12[SEL], pass transistors 15a, 15b (FIG. 1a) for each of these half-selected cells 12[HS] will also be turned on by word line WL1, connecting their respective storage nodes SNT, SNB to the unselected bit lines BLT, BLB. However, because these columns are not selected for the write cycle, neither of those bit lines BLT, BLB for the half-selected columns will be driven low by read/write circuit 25, but will be floating at their precharged voltage. In effect, these half-selected cells 12[HS] will be in the same state as during a read cycle, in which the levels at those storage nodes SNT, SNB will drive the capacitive load presented by the corresponding bit lines BLT, BLB.

It has been observed that this half-selection can upset the stored state of half-selected cells 12[HS]. Noise of sufficient magnitude coupling to the bit lines of the half-selected columns, during a write to the selected columns in the same row, can cause a false write of data to those half-selected columns. In effect, such write cycle noise can be of sufficient magnitude as to trip the inverters of one or more of the half-selected cells 12[HS]. The possibility of such stability failure is exacerbated by device mismatch and variability, as discussed above.

In conventional SRAM cells such as 6-T SRAM cell 12 of FIG. 1a, the designer is therefore faced with a tradeoff between cell stability on one hand, and write margin on the other. In a general sense, cell stability is favored by pass transistors 15a, 15b having relatively weak drive as compared with load transistors 13 and driver transistors 14, because this results in weak coupling between the bit lines and storage nodes and relatively strong drive of the latched state at storage nodes SNT, SNB. Conversely, write margin is favored by pass transistors 15a, 15b having relatively strong drive as compared with load transistors 13 and driver transistors 14, because this enables strong coupling between the bit lines and storage nodes, resulting in storage nodes SNT, SNB having weak resistance to changing state. Accordingly, the design of conventional 6-T SRAM cells 12 involves a tradeoff between these two vulnerabilities.

Unfortunately, the design window in which both adequate cell stability and adequate write margin can be attained is becoming smaller with continued scaling-down of device feature sizes, for the reasons mentioned above. In addition, it has been observed that the relative drive capability of p-channel MOS transistors relative to n-channel MOS transistors is increasing as device feature sizes continue to shrink, which skews the design window toward cell stability over write margin.

One conventional approach toward relaxing these ever-tightening design constraints is known in the art as "write-assist". According to this approach, the power supply bias applied to SRAM cells (e.g., power supply voltage $V_{dda}$ of FIG. 1) in write cycles is reduced, or disconnected so as to float. Conventional write-assist circuitry includes a power switch associated with each column of an array, or in some cases associated with multiple columns. Floating write assist bias in write cycles is attained by the power switch disconnecting cells in the selected column from the power supply voltage. In one approach, reduced voltage write assist bias turns off, in write cycles, a power switch that is connected in parallel with a diode-connected transistor between the memory cells and the power supply voltage. The cell bias in the selected column is thus at least a diode voltage drop from the full power supply voltage, during write cycles. For either reduced or floating write assist bias, the drive of the load and driver transistors in the SRAM cell is reduced relative to the drive of the pass transistors, making it easier for the low level bit line to flip the state of the addressed cell.

Another conventional approach addressing the shrinking design window to satisfy both cell stability and write margin constraints is the construction of high performance SRAM memories using eight transistor ("8-T") memory cells. As known in the art, the 8-T SRAM cell consists of a 6-T latch as shown in FIG. 1a, in combination with a two-transistor read buffer. Each cell receives separate read and write word lines and separate read and write bit lines. The complementary write bit lines are selectively coupled to the storage nodes of the 6-T latch by the pass transistors gated by the write word line, as in the conventional 6-T SRAM cell. The read buffer includes the series connection of a drive transistor gated by one of the storage nodes and a pass transistor gated by the read word line, connected between a reference voltage (e.g., ground) and the read bit line. In this 8-T construction, the pass transistors involved in the write cycle can have strong drive to provide good write margin, without affecting cell stability during read operations (because those pass transistors remain off). However, in an interleaved architecture, half-selected cells in a write cycle (i.e., cells in the selected row that are not being written) can still exhibit cell instability, because the write word line will be energized in that situation. To avoid this situation, the 8-T cells are implemented in a non-interleaved architecture, in which the entire selected row of cells is written in a write cycle. As known in the art, non-interleaved memory arrays are vulnerable to multiple-bit soft error failures, and consume additional chip area. In addition, these conventional 8-T cells source a single-ended read, rather than the differential signal sourced by the 6-T cell; either the read signal is reduced as a result, or the device sizes for the read buffer must be increased to compensate for that weaker signal.

By way of further background, my copending and commonly assigned U.S. patent application Ser. No. 12/827,706, filed Jun. 24, 2010, entitled "Bit-by-Bit Write Assist for Solid-State Memory", describes a solid-state memory in which write assist circuitry is implemented within each memory cell. As described in this application, each memory cell includes a pair of power switch transistors that selectably apply bias (either power supply voltage $V_{dd}$ or ground) to the inverters of the memory cell. One of the power switch transistors is gated by a word line indicating selection of the row containing the cell, and the other is gated by a column select signal indicating selection of the column containing the cell in a write cycle. Upon a write to the cell, both power switch transistors are turned off, removing bias from the inverter. With bias removed from the inverters, the writing of an opposite cell state is facilitated.

By way of further background, my copending and commonly assigned U.S. patent application Ser. No. 12/834,914, filed Jul. 13, 2010, entitled "Memory Cell with Equalization Write Assist Solid-State Memory", describes a solid-state memory in which equalization transistors are included within each memory cell. In each selected memory cell in a write cycle, those equalization transistors are turned on to short the storage nodes to one another. The bit line driven by the write circuitry can then more readily define the state of the cross-coupled inverters, by eliminating the tendency of those inverters to maintain the previously stored latch state.

By way of further background, Takeda et al., "A Read-Static-Noise-Margin-Free SRAM Cell for Low-VDD and High-Speed Applications", *J. Solid-State Circuits*, Vol. 41, No. 1 (IEEE, January 2006), pp. 113-21, describes a seven-transistor (7-T) SRAM cell in which an additional transistor is included in series with one of the inverters, and is gated by the word line. The inverter that includes the extra series transistor has its common drain node coupled to its bit line only in write cycles (i.e., by a "write word line"); the opposing inverter drives its bit line in read cycles. This single-ended read limits the number of cells that can connect to the same bit line, because of the reduced read signal strength. The chip area efficiency is thus impacted by that constraint, and also because of the three separate word lines that must now be routed to each cell. In addition, the asymmetric layout of the 7-T cell precludes implementation in an interleaved array architecture, increasing the likelihood of multiple-bit soft errors, and further reducing chip area efficiency.

BRIEF SUMMARY OF THE INVENTION

Embodiments of this invention provide a memory cell, and method of operating the same, in which read stability is improved without impacting write margin.

Embodiments of this invention provide such an array and method in which design constraints on the memory cells can be skewed to favor write margin without sacrificing cell stability.

Embodiments of this invention provide such an array and method that can be implemented in an interleaved array architecture.

Embodiments of this invention provide such an array and method that are compatible with modern sub-micron transistor sizes in which the drive of p-channel load transistors in the memory cells approaches that of n-channel driver transistors.

Other objects and advantages of this invention will be apparent to those of ordinary skill in the art having reference to the following specification together with its drawings.

The present invention may be implemented into a static random access memory (SRAM) cell of the cross-coupled inverter type, by way of an isolation gate included within the cell and connected between the input of one of the inverters and the opposite storage node (i.e., the output of the other inverter). The isolation gate can be constructed as complementary metal-oxide-semiconductor (MOS) transistors connected in parallel, receiving complementary versions of a column-based isolation control signal at their respective gates. The isolation control signal is controlled in response to a read/write control signal, so that the isolation gate is turned off during read cycles. In an interleaved array architecture, the isolation control signal is also asserted to turn off the isolation gate for cells in unselected columns during a write cycle to the selected columns.

DETAILED DESCRIPTION OF THE INVENTION

The present invention will be described in connection with its embodiments, namely as implemented into a static random access memory (SRAM) embedded within a larger scale integrated circuit, and constructed according to complementary metal-oxide-semiconductor (CMOS) technology, because it is contemplated that this invention is especially beneficial in such an application. However, it is contemplated that those skilled in the art having reference to this specification will readily recognize that this invention may be applied to a wide range of memory devices. Accordingly, it is to be understood that the following description is provided by way of example only, and is not intended to limit the true scope of this invention as claimed.

Figure 2:
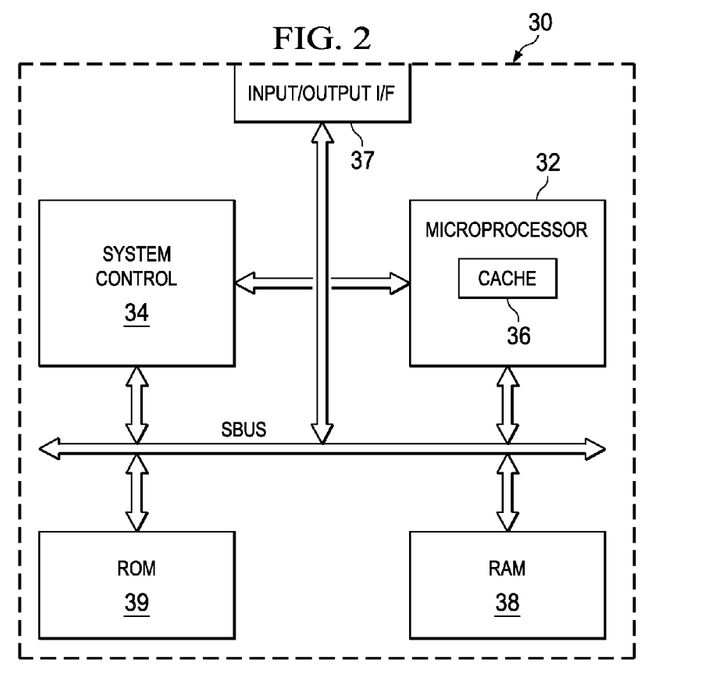
FIG. 2 is an electrical diagram, in block form, of a large scale integrated circuit constructed according to embodiments of the invention.

FIG. 2 illustrates an example of large-scale integrated circuit 30, in the form of a so-called "system-on-a-chip" ("SoC"), as now popular in many electronic systems. Integrated circuit 30 is a single-chip integrated circuit into which an entire computer architecture is realized. As such, in this example, integrated circuit 30 includes a central processing unit of microprocessor 32, which is connected to system bus SBUS. Various memory resources, including random access memory (RAM) 38 and read-only memory (ROM) 39, reside on system bus SBUS and are thus accessible to microprocessor 32. Typically, ROM 39 serves as program memory, storing the program instructions executable by microprocessor 32, while RAM 38 serves as data memory; in some cases, program instructions may reside in RAM 38 for recall and execution by microprocessor 32. Cache memory 36 (such as level 1, level 2, and level 3 caches, each typically implemented as SRAM) provides another memory resource, and resides within microprocessor 32 itself and therefore does not require bus access. Other system functions are shown, in a generic sense, in integrated circuit 30 by way of system control 34 and input/output interface 37.

Those skilled in the art having reference to this specification will recognize that integrated circuit 30 may include additional or alternative functions to those shown in FIG. 2, or may have its functions arranged according to a different architecture from that shown in FIG. 2. The architecture and functionality of integrated circuit 30 is thus provided only by way of example, and is not intended to limit the scope of this invention.

Figure 3:
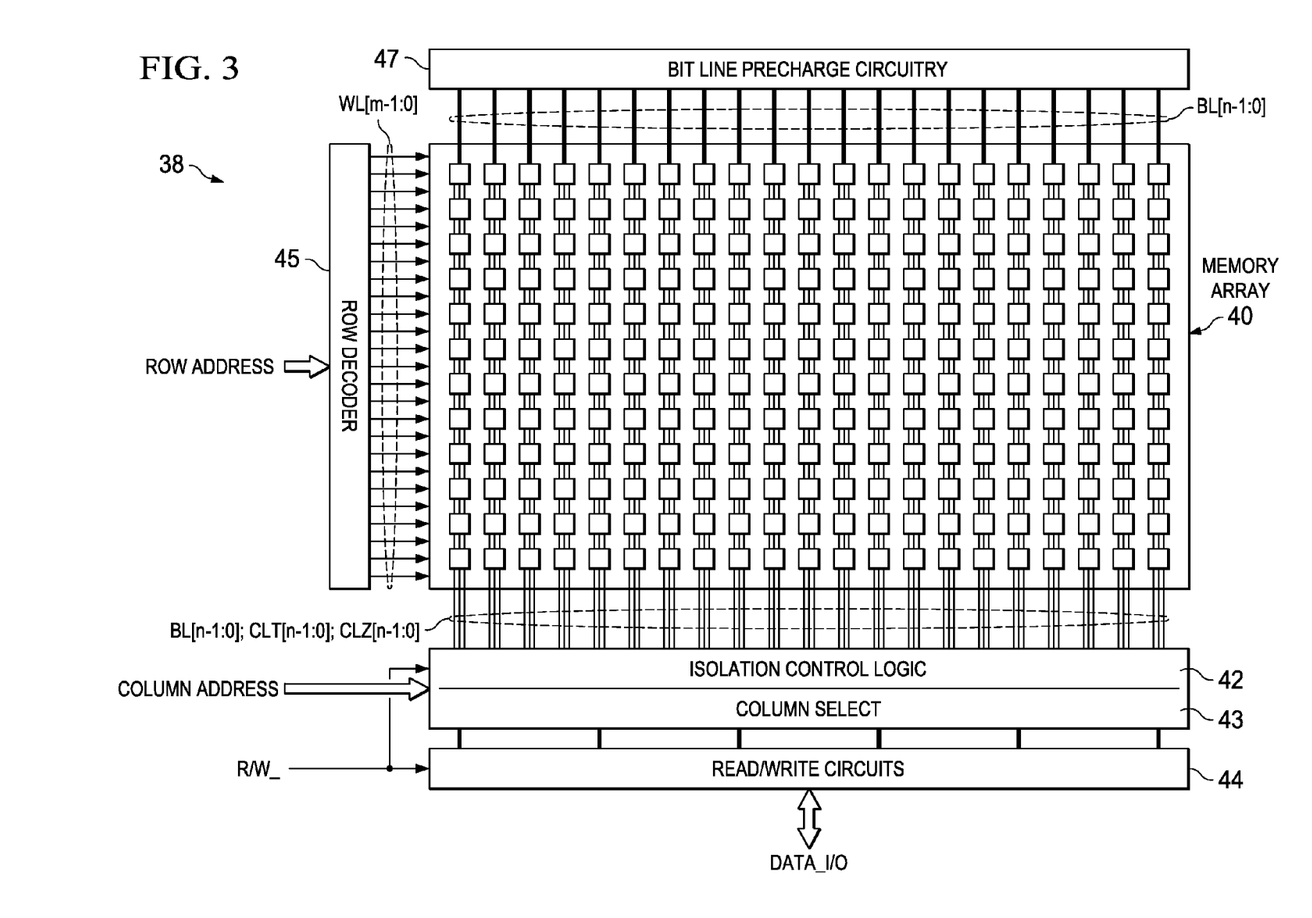
FIG. 3 is an electrical diagram, in block form, of a memory in the integrated circuit of FIG. 2, constructed according to an embodiment of the invention.

Further detail in connection with the construction of RAM 38 in integrated circuit 30 is illustrated in FIG. 3. Of course, a similar construction may be used to realize other memory resources such as cache memory 36; further in the alternative, RAM 38 may correspond to a stand-alone memory integrated circuit (i.e., rather than as an embedded memory as shown in FIG. 2). Those skilled in the art having reference to this specification will comprehend that the memory architecture of RAM 38 in FIG. 3 is provided by way of example only.

In this example, RAM 38 includes many memory cells arranged in rows and columns within memory array 40. While a single instance of memory array 40 is shown in FIG. 3, it is to be understood that RAM 38 may include multiple memory arrays 40, each corresponding to a memory block within the address space of RAM 38. The construction of these memory cells according to embodiments of this invention will be described in further detail below. In this example, memory array 40 includes m rows and n columns of SRAM cells, with cells in the same column sharing a pair of bit lines BL[n−1:0], and with memory cells in the same row sharing one of word lines WL[m−1:0]. Bit line precharge circuitry 47 is provided to apply a desired precharge voltage to the pairs of bit lines BL[n−1:0] in advance of read and write operations. Row decoder 45 receives a row address value indicating the row of memory array 40 to be accessed, and energizes the one of word lines WL[m−1:0] corresponding to that row address value. Column select circuit 43 receives a column address value, and in response selects pairs of bit lines BL[n−1:0] associated with one or more columns to be placed in communication with read/write circuits 44. In this embodiment of the invention, column select 43 receives the two least significant bits of the column address, and selects the pair of bit lines BL[n−1:0] for one column out of each group of four adjacent columns. In this "interleaved" architecture, a given memory address selects one of every x (e.g., one of every four) columns for read or write access. The data words stored in memory array 40 are thus interleaved with one another.

In embodiments of this invention, isolation control logic 42 generates complementary signals on isolation control lines CLT[n−1:0], CLZ[n−1:0] responsive to read/write control signal R/W_, and also according to the column address value in interleaved arrays, as will be described in further detail below. These isolation control lines CLT[n−1:0], CLZ[n−1:0] are connected to isolation transistors in each memory cell in each of the n columns of memory array 40, as will also be described in further detail below. Read/write circuits 44, which may be realized as conventional sense amplifiers and write circuits as known in the art for SRAM devices, are in communication with bus DATA I/O, by way of which output data and input data are communicated from and to the addressed memory cells within memory array 40, in the conventional manner.

Figure 4:
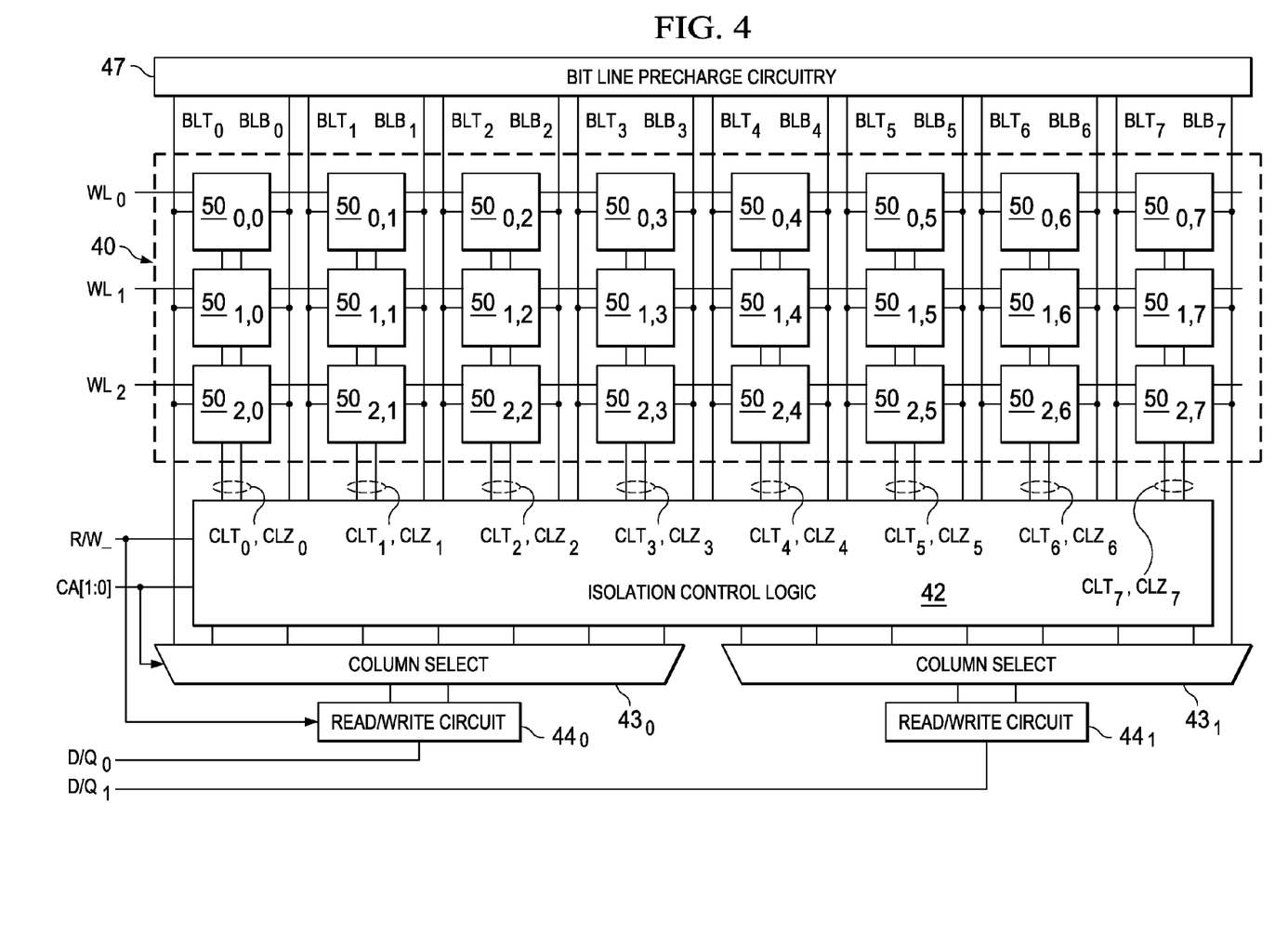
FIG. 4 is an electrical diagram, in schematic form, of a portion of a memory array and peripheral circuits, according to an embodiment of the invention.

This interleaved arrangement of memory array 40 is illustrated in further detail in FIG. 4, with reference to a 3-row-by-8-column portion of memory array 40. The portion of memory array 40 shown in FIG. 4 includes portions of rows j=0 through 2, and portions of columns k=0 through 7. Memory cells $50_{0,0}$ through $50_{0,7}$ receive word line $WL_0$, memory cells $50_{1,0}$ through $50_{1,7}$ receive word line $WL_1$, and memory cells $50_{2,0}$ through $50_{2,7}$ receive word line $WL_2$. Word lines WL are driven from row decoder 45 as shown in FIG. 3. Memory cells $50_{0,0}$ through $50_{2,0}$ in column k=0 share bit lines $BLT_0$, $BLB_0$ and isolation control lines $CLT_0$, $CLZ_0$; memory cells $50_{0,1}$ through $50_{2,1}$ in column k=1 share bit lines $BLT_1$, $BLB_1$ and isolation control lines $CLT_1$, $CLZ_1$; and so on. In this embodiment of the invention bit lines $BLT_k$, $BLB_k$ are each connected to bit line precharge circuitry 47 on one side of memory array 40. On the other side of memory array 40, bit lines $BLT_k$, $BLB_k$ for k=0 through 3 are connected to inputs of 4:1 column select circuit $43_0$, and bit lines $BLT_k$, $BLB_k$ for k=4 through 7 are connected to inputs of 4:1 column select circuit $43_1$. Column select circuits 43 receive the least two significant column address bits CA[1:0] (or decoded versions thereof) to select one of the four bit line pairs $BLT_k$, $BLB_k$ for communication with a corresponding one of read/write circuits $44_0$, $44_1$. Read/write circuit $44_0$ is connected to input/output line $D/Q_0$, and read/write circuit $44_1$ is connected to input/output line $D/Q_1$, in this example.

As mentioned above, memory cells $50_{j,k}$ in the same column k all receive isolation control lines $CLT_k$, $CLZ_k$, which in this case are driven from isolation control logic 42. In this interleaved architecture, isolation control logic 42 drives these isolation control lines $CLT_k$, $CLZ_k$ in complementary fashion with one another. Specifically, isolation control logic 42 drives isolation control lines $CLT_k$, $CLZ_k$ for column k to an active level (high and low logic levels, respectively), or to an inactive level (low and high, respectively) in response to a portion of the column address and in response to read/write control signal R/W_, to improve cell stability without degrading write margin, as will become apparent from the following description.

The construction of memory cells arranged in memory array 50, according to embodiments of this invention, will now be described in connection with FIG. 5. This construction will be described using, by way of example, SRAM cells formed of cross-coupled CMOS inverters, because it is contemplated that this invention is especially beneficial when used in connection with such memory cells. However, it is also contemplated that embodiments of this invention will provide important benefits in memories of other types, such as SRAM cells with resistor loads, 8-T or 10-T SRAM cells (e.g., SRAM cells including separate read and write bit lines), ferroelectric static RAM (FeRAM) cells based on cross-coupled inverters, and the like. It is contemplated that those skilled in the art having reference to this specification will be readily able to apply embodiments of this invention to advantage in connection with such other memory cell types and technologies.

Figure 5:
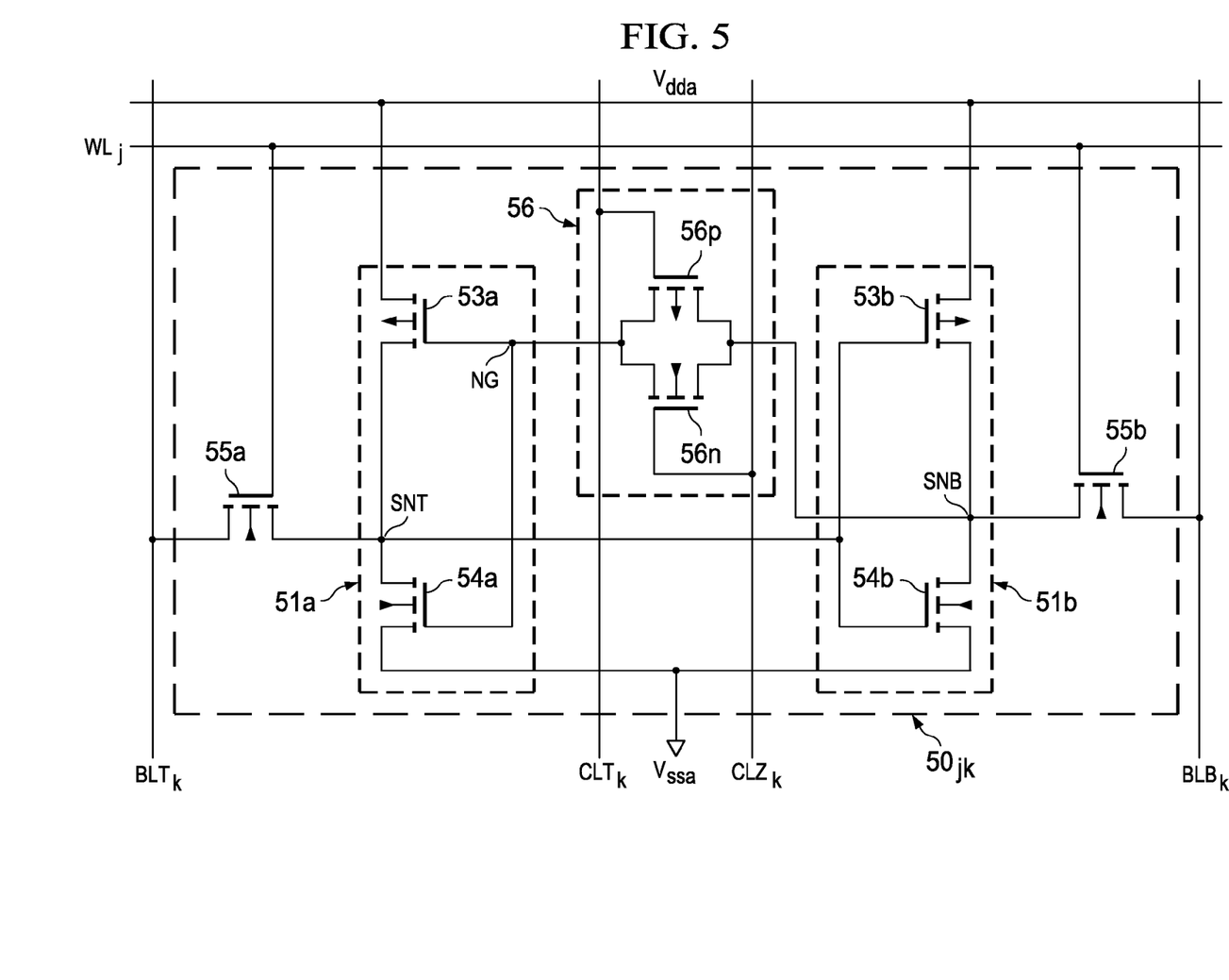
FIG. 5 is an electrical diagram, in schematic form, of a memory cell in the memory of FIGS. 3 and 4 according to an embodiment of the invention.

FIG. 5 illustrates the construction of SRAM cell $50_{jk}$ according to embodiments of this invention. In this construction, SRAM cell $50_{jk}$ includes a storage element formed by a pair of cross-coupled CMOS inverters $51a$, $51b$. As shown in FIG. 5, inverter $51a$ is formed by p-channel MOS load transistor $53a$ and n-channel MOS driver transistor $54a$, which have their drains connected together at storage node SNT and their gates connected together at common gate node NG. The source of load transistor $53a$ is connected to power supply node $V_{dda}$, and the source of driver transistor $54a$ is connected to ground, or reference, node $V_{ssa}$. Inverter $51b$ in SRAM cell $50_{jk}$ consists of p-channel MOS load transistor $53b$ and n-channel MOS driver transistor $54b$. The drains of transistors $53b$, $54b$ are connected together at storage node SNB, and their gates are connected together and connected to storage node SNT, in the usual manner for cross-coupled inverters in an SRAM cell. The source of transistor $53b$ is at power supply node $V_{dda}$ and the source of transistor $54b$ is at ground node $V_{ssa}$. Storage nodes SNT and SNB constitute complementary storage nodes in SRAM cell $50_{jk}$, in that when SRAM cell $50_{jk}$ is not accessed, their logic states are complementary to each other (one at a logic "0" and the other at a logic "1").

When deployed in a memory architecture such as that described above relative to FIGS. 3 and 4, SRAM cell $50_{jk}$ corresponds to the memory cell in row j and column k of that memory array 40. As such, SRAM cell $50_{jk}$ includes n-channel MOS pass transistor $55a$ with its source/drain conduction path connected between storage node SNT and bit line $BLT_k$ (for column k in memory array 40); similarly, n-channel MOS pass transistor $55b$ has its source/drain conduction path connected between storage node SNB and bit line $BLB_k$. The gates (i.e., control terminals) of pass transistors $55a$, $55b$ are connected to word line $WL_j$, which is driven by row decoder 45 responsive to the received row address indicating selection of row j. In the architecture of FIG. 3, for example, bit lines $BLT_k$, $BLB_k$ are coupled to bit line precharge circuitry 47, on one end, and to column select circuitry 42, on the other. Each of memory cells 50 in column k of memory array 40 are, of course, also coupled to bit lines $BLT_k$, $BLB_k$. Similarly, each of memory cells 50 in row j of memory array 40 are coupled to word line $WL_j$.

According to embodiments of this invention, isolation gate 56 is included within each SRAM cell $50_{jk}$, connected between storage node SNB and common gate node NG at the gates of transistors $53a$, $54a$ of inverter $51a$. In effect, isolation gate 56 selectively couples and de-couples common gate node NG to and from storage node SNB at the output of inverter $51b$. As described above, the gates of transistors $53b$, $54b$ of inverter $51b$ are connected directly to storage node SNT in the conventional manner for cross-coupled 6-T SRAM cells.

Isolation gate 56 is constructed, in this embodiment of the invention, as complementary (i.e., of complementary channel conductivity type) transistors $56p$, $56n$, arranged as a CMOS pass gate. More specifically, the conduction paths of transistors $56p$, $56n$ (in the form of their source-drain paths) are connected in parallel between storage node SNB and common gate node NG. In this example, p-channel MOS transistor $56p$ has its control terminal, in the form of its gate, connected to isolation control line $CLT_k$, and n-channel MOS transistor $56n$ has its control terminal (i.e., gate) connected to complementary isolation control line $CLZ_k$. As will be evident from the following description, isolation control line $CLT_k$ will be at a logic low simultaneously with isolation control line $CLZ_k$ at a logic high level, and vice versa, so that transistors $56p$, $56n$ are either both on or both off in operation. Isolation control lines $CLT_k$, $CLZ_k$ are connected to gates of corresponding transistors $56p$, $56n$, respectively, in each SRAM cell 50 in column k of memory array 40, controlling the state of isolation gate 56 along that entire column. The use of complementary transistors $56p$, $56n$ in isolation gate 56 is desirable to ensure that a fully conductive path remains present between storage node SNB and common gate node NG at the gates of transistors $53a$, $54a$ with isolation gate 56 turned on (i.e., conductive), regardless of the voltage or polarity between those two nodes.

Referring back to the interleaved architecture of FIG. 3, isolation control logic 42 asserts isolation control lines $CLT_k$, $CLZ_k$ to an active level (high and low logic levels, respectively), or to an inactive level (low and high, respectively) in response to a portion of the column address and in response to read/write control signal R/W_. In general terms, according to this invention, isolation gate 56 in a given cell $50_{jk}$ in a selected row j is intended to be turned off to isolate the gates of transistors $53a$, $54a$ from storage node SNB during read cycles, and also in write cycles in which its column k is not selected. Isolation gate 56 is turned on (or remains on), coupling the gates of transistors $53a$, $54a$ (at common gate node NG) to storage node SNB, for write cycles to those SRAM cells $50_{jk}$ in the selected row j and in selected column(s) k. The state of isolation gate 56 is not relevant for those cells $50_{jk}$ in unselected rows, because pass transistors $55a$, $55b$ remain off in those cycles; as such, isolation control lines $CLT_k$, $CLZ_k$ can be generated in common for the entire column k, according to embodiments of this invention. During standby (i.e., neither a read or write cycle is occurring), isolation control logic 42 maintains isolation control lines $CLT_k$, $CLZ_k$ inactive (low and high, respectively), so that isolation gate 56 remains on for all cells 50, to retain their respective stored data states.

Figure 6:
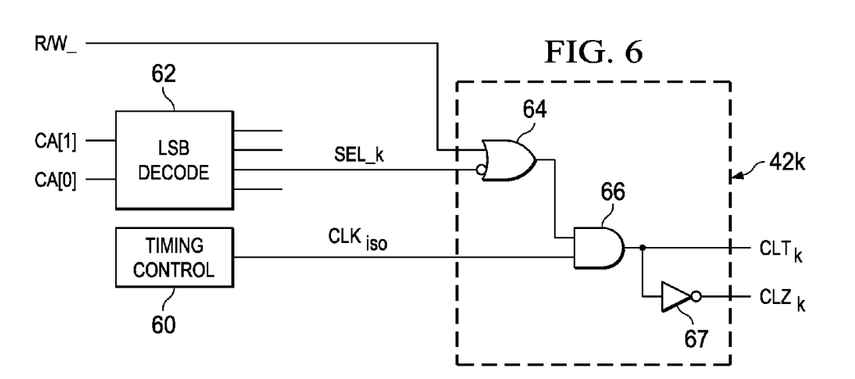
FIG. 6 is an electrical diagram, in a generalized schematic and block form, of isolation control logic in the memory of FIGS. 3 and 4 according to an embodiment of the invention.

FIG. 6 illustrates a generalized example of the construction of isolation logic instance $42_k$, for column k of memory array 40 of FIGS. 3 and 4, according to this embodiment of the invention. It is of course contemplated that those skilled in the art having reference to this specification will be readily able to realize an optimized logic implementation for isolation logic 42 for particular implementations, using conventional design techniques. As shown in FIG. 6, isolation logic $42_k$ receives read/write enable signal R/W_ from control circuitry (not shown) elsewhere in RAM 38. In addition, timing control circuitry 60 of RAM 38 provides clock signal $CLK_{iso}$ to isolation logic $42_k$ for control of the timing of the operation of isolation gates 56 in column k, as will become apparent from the following description; this clock signal $CLK_{iso}$ may be applied in common to isolation logic 42 for all columns in memory array 40. LSB decode 62 is a portion of column decode circuitry in RAM 38. In this example, in which column select circuits $43_0$, $43_1$ are 4:1 select circuits (i.e., select one of four columns), LSB decode 62 receives the two least significant bits CA[1:0] of the column address applied to RAM 38, and generates four decoded select signals including signal SEL_k for column k. Decoded select signal SEL_k may, of course, be one of the select signals applied to column select circuits $43_0$, $43_1$.

In this simplified arrangement shown in FIG. 6, isolation logic $42_k$ includes OR gate 64, which receives read/write enable signal R/W_ at one input, and decoded select signal SEL_k at an inverted input. The output of OR gate 64 is applied to one input of AND gate 66, which receives clock signal $CLK_{iso}$ at its other input. The output of AND gate 66 drives isolation control lines $CLT_k$ and (via inverter 67) $CLZ_k$. In operation, OR gate 64 generates a high logic level at its output in response to either read/write enable signal R/W_ being at a high logic level (indicating a read cycle), or decoded select signal SEL_k at a low logic level (indicating that column k is not selected by the two LSBs of the column address. This high logic level at the output of OR gate 64 is gated by clock signal $CLK_{iso}$, as will be described below, to drive high and low logic levels at isolation control lines $CLT_k$, $CLZ_k$, respectively, to turn off isolation gate 56. In this embodiment of the invention, clock signal $CLK_{iso}$ is asserted within each memory access cycle by timing control circuit 60 slightly before energizing of the selected word line $WL_j$, and is de-asserted at or slightly after that selected word line $WL_j$ is turned off.

According to this embodiment of the invention, and by way of the generalized construction of isolation logic $42_k$ for column k as shown in FIG. 6, isolation gate 56 for column k is turned off during a portion of read cycles (regardless of column address), and during a portion of write cycles in which column k is not selected. Conversely, isolation gate 56 is turned on and remains on during the entirety of write cycles, for selected columns k. It has been discovered, according to this invention, that this operation of isolation gate 56 serves to greatly improve the stability of SRAM cells $50_{jk}$, for all cells in read cycles and for half-selected cells in write cycles, as will now be described in connection with the timing diagrams of FIGS. 7a and 7b.

Figure 7A:
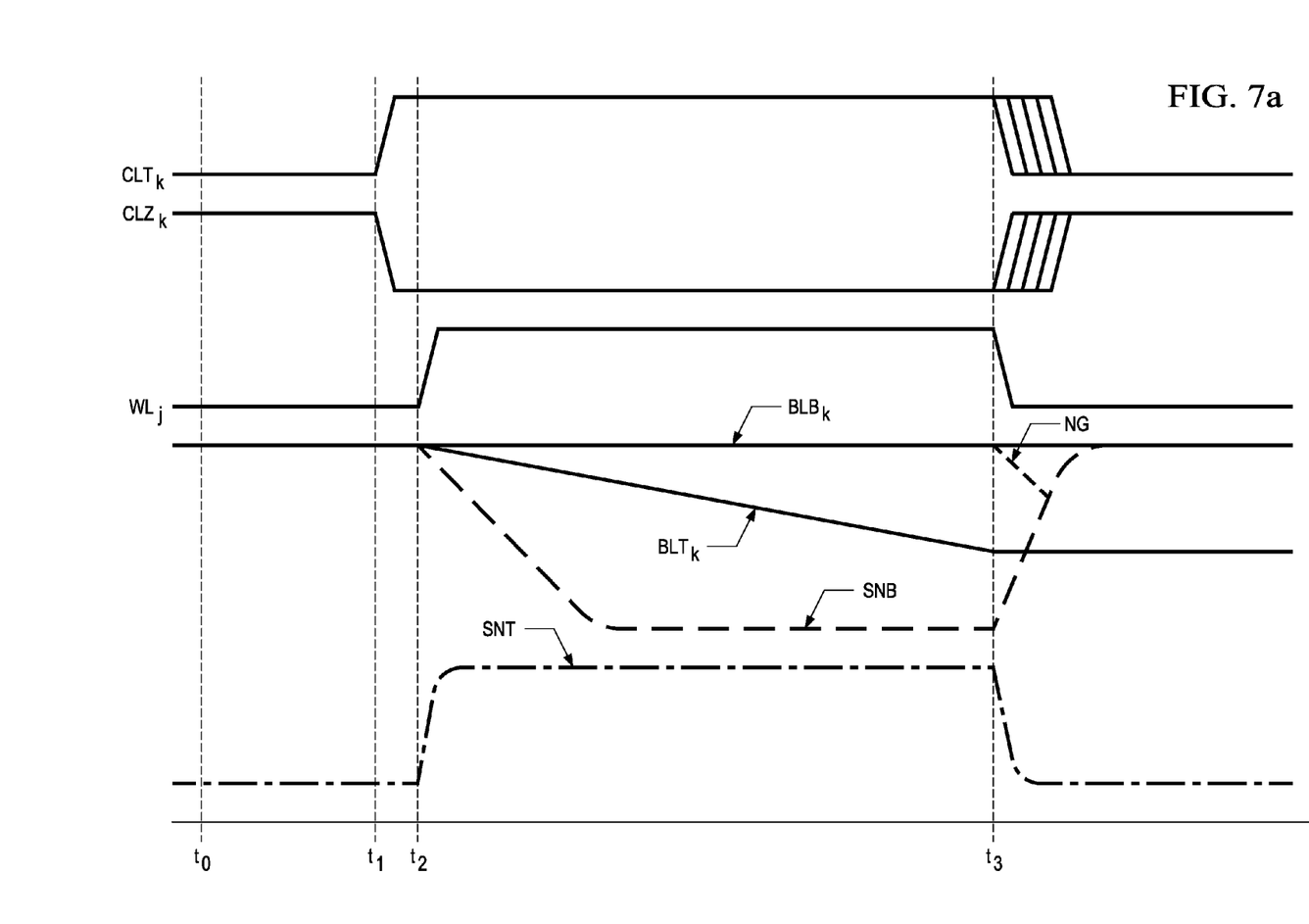
FIGS. 7*a* and 7*b* are timing diagrams illustrating the operation of the memory of FIGS. 3 and 4 according to an embodiment of the invention.

FIG. 7a is a timing diagram illustrating the timing relationship among various signals, and also the response of an instance of SRAM cells $50_{jk}$ to those signals, in the memory of FIGS. 3 and 4 and according to an embodiment of the invention. More particularly, FIG. 7a illustrates the case in which SRAM cell $50_{jk}$ of FIG. 5 is storing a "0" data state (i.e., storage node SNT is at a low "0" level, and storage node SNB is at a high "1" logic level), during a read cycle (regardless of whether column k is selected) in which row j is selected, or during a write cycle in which row j containing SRAM cell $50_{jk}$ is selected and in which column k containing SRAM cell $50_{jk}$ is not selected. Insofar as the signals shown in FIG. 7a, and SRAM cell $50_{jk}$ itself, are concerned, those two situations are identical.

At the beginning of the cycle shown in FIG. 7a, for example at time $t_0$, bit lines $BLT_k$, $BLB_k$ are both precharged to a high logic level by bit line precharge circuitry 47. Word line $WL_j$ is at a low logic level, maintaining pass transistors 55a, 55b off. Isolation control signals $CLT_k$, $CLZ_k$ for all columns are at low and high logic levels, respectively, such that isolation gate 56 is turned on in each SRAM cell $50_{jk}$. In SRAM cell $50_{jk}$ in this example, storage nodes SNT, SNB are at full "0" and "1" logic levels, respectively, corresponding to the stored "0" data state. Because pass transistors 55a, 55b are both off with word line $WL_j$ low, the precharged levels at bit lines $BLT_k$, $BLB_k$ do not affect the levels of storage nodes SNT, SNB.

In this example in which SRAM cell $50_{jk}$ is in a selected row j during a read cycle, or in an unselected column k of selected row j during a write cycle, isolation control logic $42_k$ of FIG. 6 drives a transition of isolation control signals $CLT_k$, $CLZ_k$ to high and low logic levels, respectively, at time $t_1$. As shown in FIG. 7a, word line $WL_j$ is energized to a high logic level at time $t_2$, which is shortly after the transition of isolation control signals $CLT_k$, $CLZ_k$ at time $t_1$. This short delay between the energizing of isolation control signals $CLT_k$, $CLZ_k$ at time $t_1$ and the energizing of word line $WL_j$ for the selected row j at time $t_2$ turns isolation gate 56 off, and thus isolates common gate node NG from storage node SNB in the arrangement of FIG. 5, before pass transistors 55a, 55b couple storage nodes SNT, SNB to their respective bit lines $BLT_k$, $BLB_k$.

Once word line $WL_j$ is energized at time $t_2$, in this example, the voltages at storage node SNT is affected by the precharged voltage at its bit line $BLT_k$, and vice versa. As shown in FIG. 7a after time $t_2$, storage node SNT is pulled up from its initial low level, while storage node SNB is pulled down from its initial high level; conversely, because storage node SNT is actively pulled low by driver transistor 54a, bit line $BLT_k$ is pulled down upon pass transistor 55a being turned on by word line $WL_j$. Because the initial state at storage node SNB is a high level (and its driver transistor 54b is off), bit line $BLB_k$ is not pulled from its precharged high level. However, the rising level at storage node SNT following time $t_2$ affects inverter 51b by slightly turning off load transistor 53b and slightly turning on driver transistor 54b. The voltage at storage node SNB begins to fall, as a result.

In the conventional 6-T SRAM cell 12 of FIG. 1a, the falling voltage at storage node SNB due to the pulling up of storage node SNT, in this situation, would be fed back to the gates of transistors 13a, 13b, in turn driving storage node SNT to a higher voltage yet. That higher voltage would, in turn, be fed back to transistors 13b, 14b and drive storage node SNB to a lower voltage. This feedback can cause conventional SRAM cell 12 to undesirably and unintentionally change its stored state, amounting to a cell stability failure. As mentioned above, this likelihood of this effect is reduced by constructing conventional 6-T SRAM cells with relatively weak pass transistors 15a, 15b, which reduces the coupling between bit lines $BLT_k$, $BLB_k$ and storage nodes SNT, SNB at the initiation of the cycle, but at a cost of reduced write margin.

Referring again to SRAM cell $50_{jk}$ of FIG. 5 according to this embodiment of the invention, however, isolation gate 56 is turned off prior to word line $WL_j$ being turned on. Accordingly, the falling voltage at storage node SNB is not communicated to node NG at the gates of transistors 53a, 53b of inverter 51a. This breaks the feedback loop between storage nodes SNT, SNB. Gate node NG of inverter 51a remains at its initial high voltage level, and is not driven from storage node SNB (nor is another discharge path present) following time $t_2$. As shown in FIG. 7a, the rise in voltage at storage node SNT following time $t_2$ levels off after a short time. The likelihood of SRAM cell $50_{jk}$ changing state in this read cycle, or in unselected columns during write cycles, is therefore greatly reduced.

Later in the cycle at time $t_3$, word line $WL_j$ is de-energized. Isolation control logic 42 drives isolation control signals $CLT_k$, $CLZ_k$ to low and high logic levels, respectively, at or shortly after time $t_3$, to again turn on isolation gate 56 in SRAM cell $50_{jk}$. A slight delay between the de-energizing of word line $WL_j$ at time $t_3$ and the transitions at isolation control signals $CLT_k$, $CLZ_k$ may be desirable in some implementations, to eliminate any opportunity for the reduced differential voltage between storage nodes SNT, SNB to cause an undesired change of stored state. However, it is contemplated that such a delay may not be necessary in many implementations. In either case, upon word line $WL_j$ turning off at time $t_3$, storage nodes SNT, SNB are again isolated from their respective bit lines $BLT_k$, $BLB_k$. And upon isolation gate 56 turning back on, the reduced but still high level at storage node SNB is coupled to common gate node NG while the slightly-pulled high level at storage node SNT remains coupled to the gates of transistors 53b, 54b of inverter 51b. SRAM cell $50_{jk}$ will then rapidly latch into its previous stored state, at full logic levels due to the feedback between cross-coupled inverters 51a, 51b. A slight dip in the voltage at common gate node NG may initially be evident upon isolation gate 56 turning back on, as shown in FIG. 7a. By providing sufficient delay from time $t_3$ at which word line $WL_j$ is turned off and the time at which isolation gate 56 is turned back on, the high voltage dynamically maintained at common gate node NG will restore storage node SNT to a level at or near ground, which in turn will restore storage node SNB to a level at or near power supply voltage $V_{dda}$. In that case, the voltage at common gate node NG will not dip when isolation gate 56 is turned back on. The cycle then completes in the conventional manner.

Figure 7B:
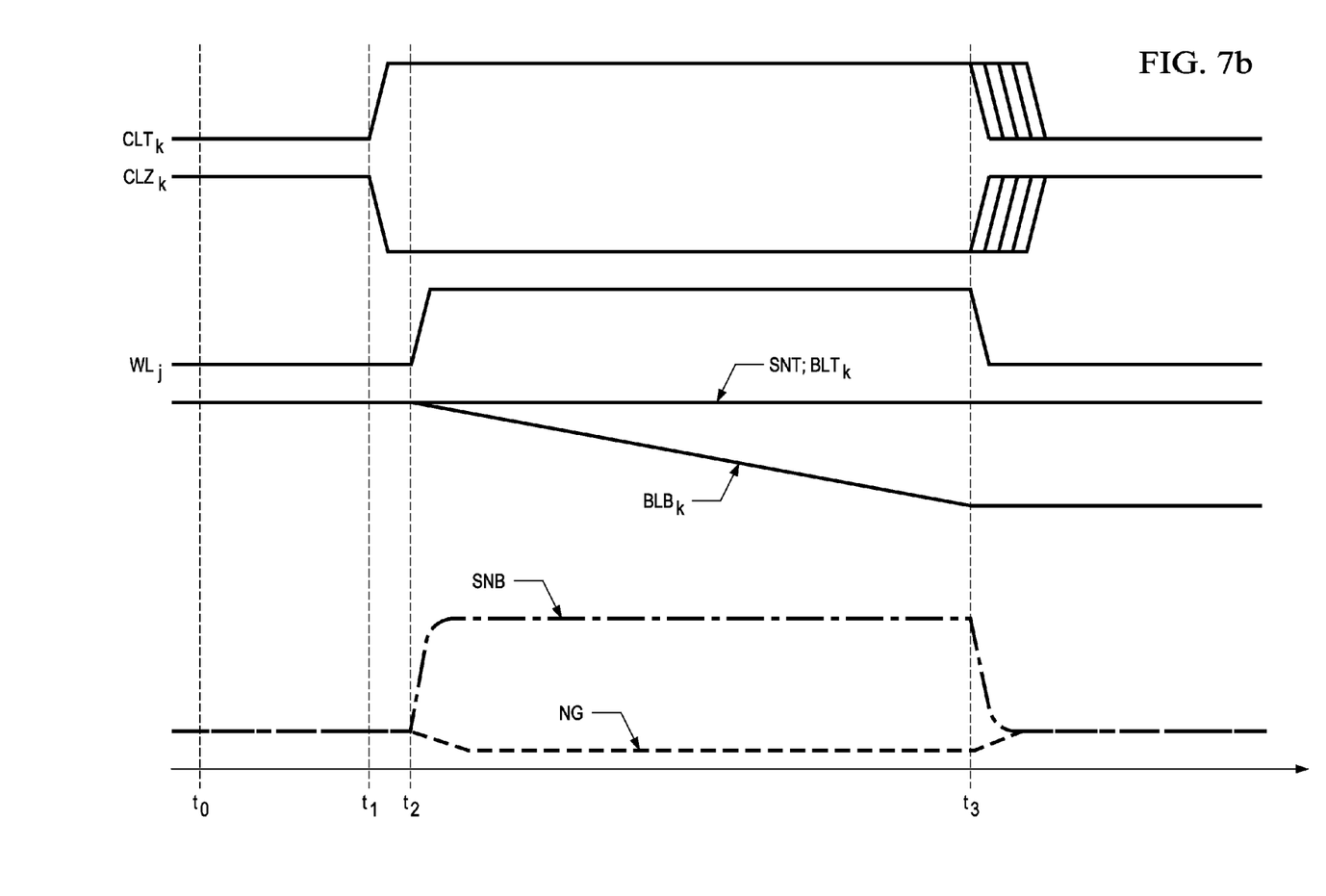

The timing diagram of FIG. 7b illustrates the behavior of SRAM cell $50_{jk}$ in a read cycle in which row j is selected, or in a write cycle in which row j is selected but column k is not selected, as before, but for the situation in which the originally stored data state is a "1" (i.e., storage node SNT is initially at a high "1" level). As before, bit lines $BLT_k$, $BLB_k$ are precharged to a high level, and storage nodes SNT, SNB are at their full high and low logic levels, respectively. And, as described above in connection with FIG. 7a, isolation control lines $CLT_k$, $CLZ_k$ are driven by isolation control logic $42_k$ to high and low logic levels, respectively, at time $t_1$, slightly before word line $WL_j$ is energized at time $t_2$.

In this situation, storage node SNB is pulled high upon pass transistor 55b being turned on at time $t_2$ by word line $WL_j$ going high and connecting storage node SNB to bit line $BLB_k$; conversely, bit line $BLB_k$ is pulled down by the active drive of driver transistor 54b. However, because isolation gate 56 is off in response to isolation control lines $CLT_k$, $CLZ_k$ going high and low, respectively, at time $t_1$, that higher voltage at storage node SNB is not communicated to common gate node NG, which remains at its initial low level. Storage node SNT, initially high, is connected by pass transistor 55a to bit line $BLT_k$, which was precharged high, causing no change at either. SRAM cell $40_{jk}$ is therefore even more stable in this situation than for the opposite data state case shown in FIG. 7a.

Upon completion of the read or write, as the case may be, word line $WL_j$ is de-energized at time $t_3$, with isolation control logic $42_k$ driving isolation control signals $CLT_k$, $CLZ_k$ to low and high logic levels, respectively, at that time or shortly thereafter. Isolation gate 56 in SRAM cell $50_{jk}$ then turns back on, and storage node SNB returns to its full low logic level once isolated from bit line $BLB_k$ upon pass transistor 55b turning off. Common node NG is again coupled to storage node SNB, to retain the stored data state.

Figure 8:
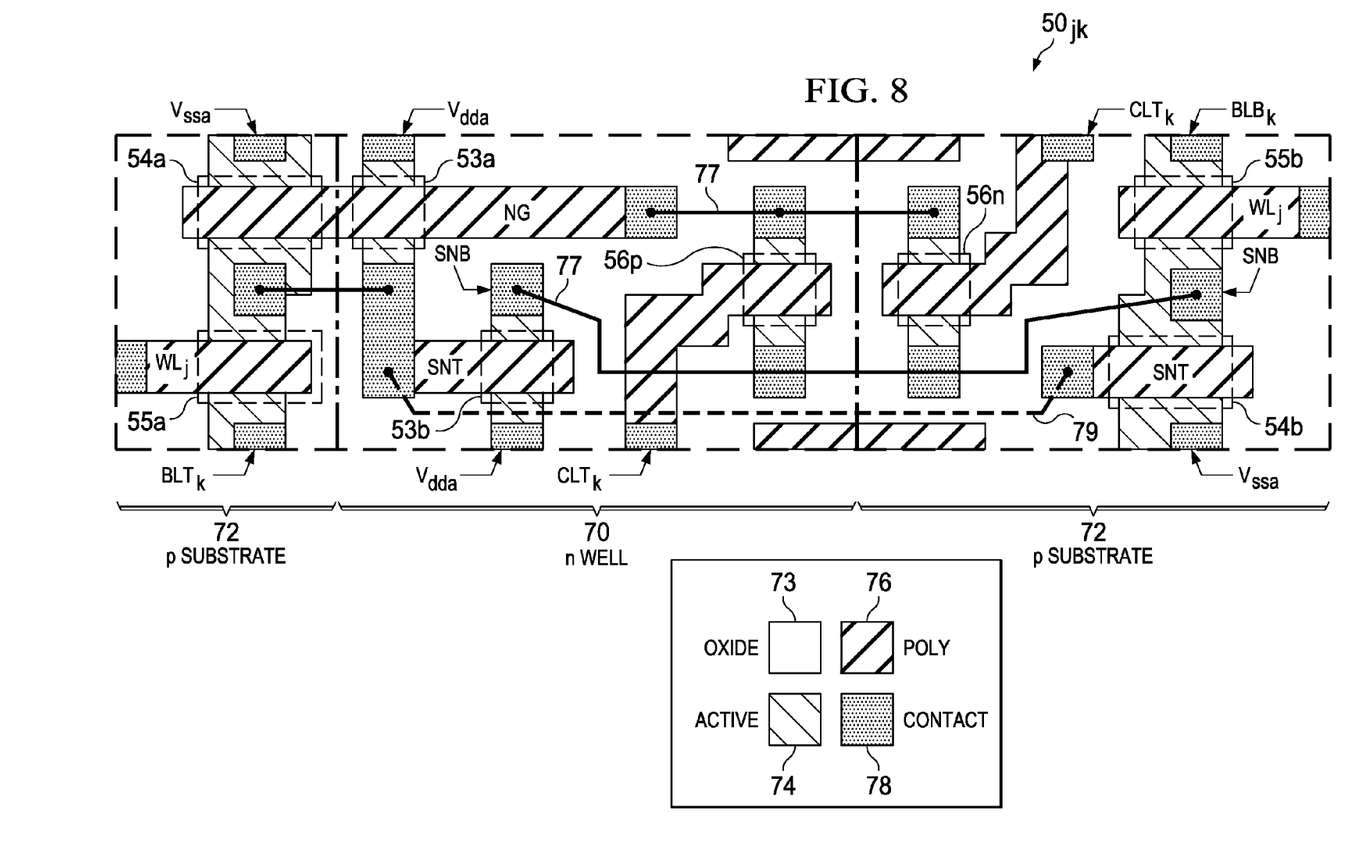
FIG. 8 is a plan view of the surface of an integrated circuit illustrating an example of the layout of the memory cell of FIG. 5 according to an embodiment of the invention.

Memory cell $50_{jk}$ constructed according to this embodiment of the invention can be realized efficiently from the standpoint of chip area, as will now be described in connection with FIG. 8. FIG. 8 illustrates, in plan view, an example of the layout of memory cell $50_{jk}$ at the surface of a silicon substrate, fabricated according to conventional CMOS technology. This plan view of FIG. 8 illustrates cell $50_{jk}$ prior to the formation of overlying metal layers, and as such illustrates diffused active regions 74, polysilicon gate elements 76, and contact openings 78 (both metal-to-active contacts, and also metal-to-poly contacts).

As shown in FIG. 8, cell $50_{jk}$ is formed into a region of p-type substrate 72, at which n-well 70 has been formed by conventional methods. N-channel MOS transistors 54a, 55a, are formed into one region of p-type substrate 72, and n-channel MOS transistors 54b, 55b, 56n are formed into another region of p-type substrate 72. P-channel MOS transistors 53a, 53b, 56p are formed into n-well 70, which in this example lies between the two regions of p-type substrate 72 in cell $50_{jk}$; adjacent cells 50 can be formed on all four sides of cell $50_{jk}$, such that n-well 70 and regions of substrate 72 can be shared from cell to cell. In the conventional manner, active regions 74 are defined at the surface, between isolation oxide structures 73 formed as LOCOS field oxide or as shallow trench isolation (STI) structures, also in the conventional manner.

Polysilicon elements 76 are patterned to extend above the surface, separated from the surface by gate oxide (not visible in this plan view) or by isolation oxide 73, as the case may be. Of course, active regions 74 within n-well 70 that are not underlying poly elements 76 will be p-type, and active regions 74 within regions of p-type substrate 72 that are not underlying poly elements 76 will be n-type. Contact openings 78 extend to active regions 74 or to poly elements 76, at the locations shown in FIG. 8 for this layout. Metal conductors (shown schematically in FIG. 8) will overly the structure, making contact via respective contact openings 78. In this example, solid lines 77 in FIG. 8 indicate metal conductors in first level metal, while dashed line 79 indicates a metal conductor in third level metal.

FIG. 8 illustrates the outline of the various transistors 53, 54, 55, 56 within cell $50_{jk}$, corresponding to the electrical schematic of FIG. 5. In this FIG. 8, as is fundamental in the art, MOS transistors are located at regions of the surface at which a gate element (i.e., poly element 76 in this example) overlies an instance of active region 74. FIG. 8 schematically illustrates internal metal connections between certain contact openings 78. For example, third level metal conductor 79 connects storage node SNT from active region 74 at the drain of transistor 53a and the gate of transistor 53b (via a shared contact opening 78) to poly element 76 serving as the gate of transistor 54b. Similarly, a first level metal conductor 77 connects storage node SNB from active region 74 between transistors 54b, 55b to contact openings 78 at active regions 74 on one side of isolation gate transistors 56n, 56p, and to active region 74 at the drain of transistor 53b. Other first level metal conductors 77 connect storage node SNT to the drain of transistor 53a and one side of pass transistor 55a, and connect common gate node NG to active regions 74 on the other side of isolation gate transistors 56n, 56p.

As evident from FIG. 8, isolation gate transistors 56n, 56p can be efficiently realized from the standpoint of chip area. In this simplified example, the additional chip area required for these devices amounts to additional width of n-well 70 and p-type substrate 72, along the horizontal dimension in the orientation of FIG. 8, without requiring an increase in the vertical dimension in that orientation. In many cases, layout constraints are more stringent in the row dimension (i.e., the vertical dimension of FIG. 8), while chip area in the column dimension is less costly. As such, while the overall chip area for the bitcell of FIG. 8 is increased by the inclusion of isolation gate 56 according to this embodiment of the invention, it is contemplated that the improved cell stability provided by this invention, along with its ability to maintain differential sensing, are an attractive combination, especially when compared against conventional read buffer-type 8-T SRAM cells.

Of course, the layout of FIG. 8 is presented by way of example only, it being understood that the particular layout of cell $50_{jk}$ can vary widely from that shown, depending on the particular manufacturing technology and design rules applicable to each implementation, and on the layout optimization arrived at by those skilled in that art.

According to embodiments of this invention, therefore, cell stability is improved for memory cells of the cross-coupled inverter type, without impacting write margin. Indeed, this improvement in cell stability can enable the designer to greatly strengthen the pass transistors to improve write margin, with reduced concern over degraded cell stability that may result. In addition, embodiments of this invention can be realized in integrated circuits at no more of a cost in chip area than conventional 8-T SRAM cells, but while still maintaining the ability to source a differential read signal. The power consumed by memory cells according to embodiments of this invention is essentially identical to that of conventional 6-T SRAM cells, such that little or no power penalty is suffered.

Of course, many variations in the particular memory arrangement can be realized in connection with embodiments of this invention, including variations to the overall memory architecture. For example, while the memory architecture of RAM 38 described above in connection with FIGS. 3 and 4 is of the interleaved type, this invention may also be beneficially applied to memory architectures of the non-interleaved type, in which each cell in the selected row is coupled to a corresponding read/write circuit in each cycle. In that architecture, referring to FIG. 3 by way of comparison, read/write circuits 44 could reside between bit lines BL[n−1:0], and column select circuits 43, with the column select circuits selecting which read/write circuits 42 (and thus which columns) are in communication with data bus DATA I/O. In that non-interleaved architecture, no SRAM cells 50 are half-selected in either a read or write cycle; specifically, in each write cycle, each cell in the selected row is actively written with a data state. Isolation control logic 42 would thus only be controlled by read/write control signal R/W_, and operable during read cycles as described above in connection with FIGS. 7a and 7b. In this implementation, the improved cell stability during read cycles enables the circuit designer to increase write margin, as discussed above. As a result, embodiments of this invention can provide important benefits in non-interleaved memory architectures.

As such, while this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory cell, comprising:
   a first inverter, having an output connected to a first storage node and having an input;
   a second inverter, having an output connected to the second storage node and an input coupled to the first storage node;
   a first pass transistor having a conduction path connected between one of the first and second storage nodes and a first bit line, and having a control terminal for receiving a word line; and
   an isolation gate, having a conduction path connected between the second storage node and the input to the first inverter, and having a first control terminal for receiving an isolation control signal.

2. The solid-state memory cell of claim 1, wherein the conduction path of the first pass transistor is connected between the first storage node and the first bit line; and further comprising:
   a second pass transistor having a conduction path connected between the second storage node and a second bit line, and having a control terminal for receiving the word line.

3. The solid-state memory cell of claim 1, wherein the isolation gate comprises:
   first and second transistors of complementary channel-conductivity type, having conduction paths connected in parallel between the second storage node and the input to the first inverter, and having control terminals coupled to receive complementary versions of the isolation control signal.

4. The solid-state memory cell of claim 3, wherein the first transistor comprises an n-channel transistor having a source/drain path connected between the second storage node and the input to the first inverter, and having a gate electrode receiving a first version of the isolation control signal;
   and wherein the second transistor comprises a p-channel transistor having a source/drain path connected between the second storage node and the input to the first inverter, and having a gate electrode receiving a second version of the isolation control signal that is at a complementary logic level from the first version of the isolation control signal.

5. The solid-state memory cell of claim 4, wherein the first and second inverters each comprise:
   an n-channel transistor, having a source coupled to a reference voltage, a gate connected to the input of the inverter, and a drain coupled to the output of the inverter; and
   a p-channel transistor, having a drain coupled to the output of the inverter and the drain of the n-channel transistor, a gate connected to the input of the inverter and to the gate of the n-channel transistor, and a source coupled to a power supply voltage.

6. A method of accessing a solid-state memory, the memory comprising a plurality of memory cells arranged in rows and columns, each row of memory cells associated with a word line, each column of memory cells associated with first and second bit lines, each memory cell storing a data state represented at complementary first and second storage nodes driven from the outputs of first and second cross-coupled inverters, respectively, the method comprising:
   receiving a memory address including a row portion and a column portion;
   in a read cycle, for at least one memory cell in a selected row corresponding to the row portion of the memory address, isolating an input of the first inverter from the second storage node;
   then coupling the first and second storage nodes of memory cells in the selected row to first and second bit lines, respectively;
   then de-coupling the first and second storage nodes of memory cells in the selected row from the first and second bit lines; and
   coupling the input of the first inverter to the second storage node in the at least one memory cell in the selected row.

7. The method of claim 6, wherein the step of coupling the input of the first inverter to the second storage node is performed after the de-coupling step in the read cycle.

8. The method of claim 6, further comprising:
   in a write cycle, coupling the input of the first inverter to the second storage node for at least one target memory cell in the selected row;
   then coupling the first and second storage nodes of memory cells in the selected row to the first and second bit lines, respectively;
   driving an input data state at one or more of the first and second bit lines associated with the at least one target memory cell, during the coupling step;
   then de-coupling the first and second storage nodes of memory cells in the selected row from the first and second bit lines.

9. The method of claim 8, wherein the at least one target memory cell is selected responsive to the column portion of the address; and further comprising, in the write cycle:

prior to the step of coupling the first and second storage nodes of memory cells in the selected row to the first and second bit lines, for at least one other memory cell in the selected row other than the at least one target memory cell, isolating an input of the first inverter from the second storage node; and simultaneously with or after the de-coupling step, coupling the input of the first inverter to the second storage node for the at least one other memory cell in the selected row.

10. The method of claim 8, further comprising:
before the driving step, precharging the first and second bit lines to a precharge voltage; and
wherein the driving step comprises driving one of the first and second bit lines of the selected columns to a voltage different from the precharge voltage, according to the input data state.

11. The method of claim 6, wherein the step of coupling the first and second storage nodes of memory cells in the selected row to the first and second bit lines, comprises:
energizing a word line associated with the selected row, the word line coupled to the gate of a first pass transistor having a conduction path between the first storage node and the first bit line, and coupled to the gate of a second pass transistor having a conduction path connected between the second storage node and the second bit line;
and wherein the step of de-coupling the first and second storage nodes of memory cells in the selected row from the first and second bit lines comprises:
de-energizing the word line.

12. The method of claim 6, wherein the step of isolating an input of the first inverter from the second storage node comprises:
turning off a pass gate connected between the input of the first inverter and the second storage node;
and wherein the step of coupling the input of the first inverter to the second storage node comprises:
turning on the pass gate.

13. The method of claim 12, wherein the pass gate comprises complementary transistors having source/drain paths connected in parallel, and having gates; wherein the turning off step comprises:
de-asserting complementary control signals connected to the gates of the complementary transistors;
and wherein the turning on step comprises:
asserting the complementary control signals.

14. The method of claim 13, wherein the de-asserting step is performed responsive to a read/write control signal indicating a read cycle;
and wherein the asserting step is performed responsive to the read/write control signal indicating a write cycle.

15. The method of claim 13, wherein the de-asserting step is performed responsive to the read/write control signal indicating a write cycle for memory cells in columns not selected by the column portion of the memory address;
and wherein the asserting step is performed responsive to the read/write control signal indicating a write cycle for memory cells in columns selected by the column portion of the memory address.

16. An integrated circuit, comprising a solid state memory, the memory comprising:
an array of solid-state memory cells arranged in rows and columns, each memory cell comprising:
a first inverter, having an output connected to a first storage node and having an input;
a second inverter, having an output connected to a second storage node and an input coupled to the first storage node;
a first pass transistor having a conduction path connected between the first storage node and a first bit line for its column, and having a control terminal connected to a word line for its row;
a second pass transistor having a conduction path connected between the second storage node and a second bit line for its column, and having a control terminal connected to the word line for its row; and
an isolation gate, having a conduction path connected between the second storage node and the input to the first inverter, and having a first control terminal for receiving an isolation control line for its column;
address select circuitry, for receiving a row address and a column address, for energizing a word line associated with a row of memory cells corresponding to the row address;
read/write circuitry coupled to the first and second bit lines of each column of memory cells; and
isolation control logic, having an input receiving a read/write control signal, for driving isolation control lines to turn off the isolation gate for memory cells in one or more columns responsive to the read/write control signal indicating a read cycle, and for driving isolation control lines to turn off the isolation gate for memory cells in one or more columns responsive to the read/write control signal indicating a write cycle.

17. The integrated circuit of claim 16, further comprising:
a column multiplexer for each group of columns, coupled to the address select circuitry, and connected between the read/write circuitry and the first and second bit lines for columns in its group of columns, for coupling, to the read/write circuitry, the first and second bit lines of a selected column in its group of columns responsive to a portion of the column address.

18. The integrated circuit of claim 17, wherein the isolation control logic also has an input receiving a portion of the column address, and is for driving isolation control lines to turn off the isolation gate, responsive to the read/write control signal indicating a write cycle, for memory cells in one or more columns not selected by the portion of the column address.

19. The integrated circuit of claim 16, wherein the isolation gate of each of the memory cells comprises:
first and second transistors of complementary channel-conductivity type, having conduction paths connected in parallel between the second storage node and the input to the first inverter, and having control electrodes coupled to complementary isolation control lines.

20. The integrated circuit of claim 19, wherein the first transistor comprises an n-channel transistor having a source/drain path connected between the second storage node and the input to the first inverter, and having a gate electrode receiving a first version of the control signal;
and wherein the second transistor comprises a p-channel transistor having a source/drain path connected between the second storage node and the input to the first inverter, and having a gate electrode receiving a second version of the control signal that is at a complementary logic level from the first version of the control signal.

21. The integrated circuit of claim 16, wherein the first and second inverters of each memory cell each comprise:
an n-channel transistor, having a source coupled to a reference voltage, a gate connected to the input of the inverter, and a drain coupled to the output of the inverter; and
a p-channel transistor, having a drain coupled to the output of the inverter and the drain of the n-channel transistor, a gate connected to the input of the inverter and to the gate of the n-channel transistor, and a source coupled to a power supply voltage.

22. The integrated circuit of claim 16, further comprising:
a logic circuit coupled to the read/write circuitry and the address select circuitry.

\* \* \* \* \*